(12) United States Patent
Suzuki et al.

(10) Patent No.: US 7,825,079 B2
(45) Date of Patent: Nov. 2, 2010

(54) CLEANING COMPOSITION COMPRISING A CHELANT AND QUATERNARY AMMONIUM HYDROXIDE MIXTURE

(75) Inventors: Tomoco Suzuki, Tokyo (JP); Atsushi Otake, Kanagawa (JP)

(73) Assignee: EKC Technology, Inc., Hayward, CA (US)

( * ) Notice: Subject to any disclaimer, the term of this patent is extended or adjusted under 35 U.S.C. 154(b) by 0 days.

(21) Appl. No.: 12/463,645

(22) Filed: May 11, 2009

(65) Prior Publication Data

US 2009/0281017 A1  Nov. 12, 2009

Related U.S. Application Data

(60) Provisional application No. 61/071,676, filed on May 12, 2008.

(51) Int. Cl.
*C11D 3/30* (2006.01)
*C11D 7/06* (2006.01)

(52) U.S. Cl. ............... 510/176; 510/175; 510/480; 510/504; 134/1.3

(58) Field of Classification Search ............ 510/175, 510/176, 480, 504; 134/1.3
See application file for complete search history.

(56) References Cited

U.S. PATENT DOCUMENTS

| | | | | |
|---|---|---|---|---|
| 5,174,872 | A | * 12/1992 | Scott | 205/779 |
| 5,759,369 | A | * 6/1998 | Menchen et al. | 204/456 |
| 2004/0180300 | A1 | * 9/2004 | Minsek et al. | 430/329 |
| 2004/0224866 | A1 | * 11/2004 | Matsunaga et al. | 510/175 |
| 2009/0131295 | A1 | * 5/2009 | Cui | 510/176 |
| 2009/0137191 | A1 | * 5/2009 | Lee | 451/36 |
| 2009/0203566 | A1 | * 8/2009 | Lee et al. | 510/175 |
| 2009/0215658 | A1 | * 8/2009 | Minsek et al. | 510/175 |

* cited by examiner

*Primary Examiner*—Charles I Boyer
(74) *Attorney, Agent, or Firm*—Dunlap Codding, P.C.

(57) ABSTRACT

The invention relates to compositions and methods for cleaning integrated circuit substrates. The compositions are in the form of an aqueous solution and include a quaternary ammonium hydroxide compound and a chelating compound. The chelating compound includes either boric acid or at least one N-substituted aminocarboxylate selected from the group consisting of N-bis(2-hydroxyethyl)glycine(bicine), N-tris(hydroxymethyl)methyl glycine (tricine) and mixtures thereof, and can optionally include glycine, Iminodiacetic acid (IDA), Nitrilo trizacetic acid (NTA), Ethylenediammine Tetraacetic acid (EDTA), or mixtures thereof.

5 Claims, No Drawings

CLEANING COMPOSITION COMPRISING A CHELANT AND QUATERNARY AMMONIUM HYDROXIDE MIXTURE

The present application claims the benefit of U.S. Provisional Application No. 61/071,676, filed on May 12, 2008 which is hereby incorporated by referenced in its entirety.

FIELD OF THE INVENTION

The present invention generally relates to compositions and methods for cleaning integrated circuit substrates. The invention more particularly relates to compositions and methods for removal of photoresist, post etch residue, and/or post planarization residue from substrates characterized by low-k or high-k dielectrics such as orthosilicate glass (OSG) and copper metallization, as well as substrates of Al or Al(Cu) metallization, wherein the compositions do not comprise a fluorine species.

BACKGROUND OF THE INVENTION

Devices with critical dimensions on the order of 65 nanometers or less have involved integration of copper conductors and low-k dielectrics. Such devices require alternating material deposition processes and planarization processes. Following almost each step in the fabrication process, e.g., a planarization step, a trenching step, or an etching step, cleaning processes are required to remove residues of the plasma etch, oxidizer, abrasive, metal or other liquids or particles remaining which contaminate the surface of the copper wafer. Fabrication of the current advanced generation of devices require copper conductors and low-k dielectric materials (typically carbon-silica or porous silica materials), both of which can react with and be damaged by various classes of prior art removers.

Low-k dielectrics in particular may be damaged in the cleaning process as evidenced by etching, changes in porosity/size, and ultimately changes in dielectric properties. A continuous wet process is required to remove the residues without any effect on damaged low-k layer, for instance k-value shift and CD loss. In addition, copper surface control is considered to be important for reliable electrical properties: oxide layer on copper surface (CuOx) is required to be removed in the wet process, and re-oxidation on the bare copper surface needs to be prevented.

The conventional cleaning compositions comprising a fluorine-containing component, solvent, and water are known. And the conventional cleaning or development compositions having a basic pH, and being comprised of tetramethylammonium hydroxide, boric acid and water are also known.

1) Japanese patent laying open no. 2003-122028, to Kenji et al., describes a composition comprising 0.5% to 10% of a fluorine compound, greater than 30% of a mixed amide/ether solvent and water, and teaches that at solvent concentrations less than 30% corrosion of the wiring material becomes intense.

2) Japanese patent laying open no. 2001-5200, to Yoko et al., describes a resist removing composition for substrates comprising aluminum wiring, the composition comprising 0.1% to 2% ammonium fluoride, 20% to 98.8% of a polar organic solvent, 0.05% to 1.9% ascorbic acid, and 1% to 79.8% water, with pH less than 5.0. The listed polar organic solvents are N,N-dimethylformamide, N,N-dimethylacetamide, dimethyl sulfoxide, ethylene glycol, and propylene glycol.

3) U.S. Pat. No. 5,792,274, to Tanabe et al., describes a remover solution composition for resist which comprises (a) 0.2% to 8% a salt of hydrofluoric acid with a metal-free base, (b) 30% to 90% of a water-soluble organic solvent such as a glycol ether, and (c) water and optionally (d) an anticorrosive, at a pH of 5 to 8.

4) U.S. Pat. No. 5,939,336 describes residue remover compositions of ammonium fluoride, propylene glycol, ammonia and water, at a pH of from 7 to 8.

5) U.S. Pat. No. 5,972,862 describes a post-etch residue remover having: (A) 0.1% to 15% of a fluorine-containing compound such as hydrofluoric acid or ammonium fluoride; (B) 1% to 80% of a polar organic solvent selected from a list including amides, lactones, alcohols, alkyl acetates, alkyl lactates, alkylene glycols, glycol ethers, and sulfoxides; (C) 0.01% to 5% of an phosphoric acid, phosphorous acid, hypophosphorous acid, polyphosphoric acid, or an organic acid; and (D) 1% to 50% of a quaternary ammonium salt. Water is not a specified component of the remover, and while there is no range specified for water, one example was described as containing 45.9% water. Examples show 1-10% NH4F, 0.1-1% organic acid, and 35-69% amide solvent, and presumably a balance (~P30% to 60%) water.

6) U.S. Pat. No. 5,792,274 describes a resist/residue remover having 0.2% to 8% of a salt of metal-free base and HF, 30% to 90% of a water-soluble organic solvent, and water where the pH is 5-8. The preferred solvents are ethylene glycol or ethylene glycol and dimethylsulfoxide.

7) U.S. Pat. No. 6,235,693 describes residue removers comprising 0.01% to 10% of fluorine compounds, 20% to 50% water, 20% to 80% of a piperidone and from 0 to 50% of an organic sulfoxide or glycol solvent, said composition having a pH between about 6 and about 10.

8) U.S. Pat. No. 6,468,951 describes a composition to remove silica residue from a borophosphosilicate semiconductor wafer, said composition having a basic or an acidic pH, and being comprised of: water; 0.01% to 95% of hydroxyl-functional solvent such as ethylene glycol or an alcohol; aqueous hydrofluoric acid; a tetraalkylammonium hydroxide; and about 0.001 wt % to about 10 wt % of a surfactant.

9) U.S. Pat. No. 6,638,899 describes a photoresist remover comprising hydrofluoric acid, a base free from metal ions, 30% to 80% of a water-soluble organic, water, and an alkali, wherein the pH of the remover is 8.5 to 10.

10) JP 3255551 describes a composition having 0.5-40% HF, 40-99.5% water, water-soluble organic solvent, and 0.5-40% anticorrosion agent, useful for removing resist in short time at low temperatures.

11) U.S. published Application No. 2004/010653 1, the disclosure of which is incorporated herein by reference thereto specifically for the semiconductor fabrication processes which form various types residue, each type of which can be removed with compositions of the present invention. This application discloses removers useful for copper/low-k material substrates, the removers comprising a metal-free salt of hydrogen fluoride; 50% to 98% of a water-soluble organic solvent; an acid; and water.

12) U.S. published Application No. 2005/006713 describes a composition to remove photoresist and Sacrificial Antireflective Coating (SAC), said composition having a basic pH, and comprising an alkaline or alkaline earth metal base, a quaternary ammonium hydroxide, oxidizer and a passivation agent. This application discloses that the concentration of quaternary ammonium hydroxide is preferably at least 2.0%. An example passivation agent is boric acid.

13) Japanese patent laying open no. H11-121419, to Hase et al., describes a composition having a basic pH, and being comprised of quaternary ammonium hydroxide, ozone and organic or inorganic acid. This application discloses that the preferable quaternary ammonium hydroxide is tetramethylammonium hydroxide (TMAH) and its concentration is at least 0.001 mol/l (7.4 wt %). In addition, this application discloses that an example inorganic acid is boric acid.

14) Finally, Japanese patent laying open no. H5-88377, to Sato et al., describes a developer composition having a basic pH, and being comprised of basic compound and organic or inorganic acid. This application discloses that an exemplary basic compound is tetramethylammonium hydroxide and an exemplary inorganic acid is boric acid. This application also discloses that the concentration of basic compounds is preferably at least 0.001 mol/l (7.4 wt % TMAH). Exemplary pHs are from 9.7 to 10.3.

Problems of the conventional fluorine compound or solvent containing cleaning compositions and the basic cleaning compositions and the method of manufacturing a semiconductor device using the same are now described below:

1) k-Value Shift and CD Loss

Recently, ultra low-k (ULK, k value<2.4) and extreme low-k (ELK, k-value<2.2) dielectric have been adopted in a 65 nanometers or less technology node. Plasma-etch processes, which have been widely used for construction of dual damascene structures, damage low-k dielectric, especially porous low-k dielectric. The conventional fluorine-based compositions or solvent containing cleaning compositions and the acidic (pH<4) or basic (pH>7) compositions increase the k-value of ULK or ELK dielectrics and cause CD loss.

2) Corrosion of Copper Surface

Copper surface control is considered to be important for reliable electrical properties. The conventional compositions containing a fluorine compound or a solvent and the conventional acidic (pH<4) or basic (pH>7) compositions corrode copper surfaces.

SUMMARY OF THE INVENTION

Broadly stated, the invention provides a water-based, neutral and non-fluorine compound containing cleaning composition for removing one or more of photoresist, etching residue, or planarization residue, and also copper oxide, from a substrate characterized by low-k or high-k dielectrics such as orthosilicate glass (OSG) and copper metallization, as well as substrates of Al or Al(Cu) metallization, in particular a low-k dielectric material.

The cleaning compositions according to the present invention exhibits excellent removal of photoresist, post etch residue, and/or post planarization residue removal ability as well as excellent copper and low-k compatibility.

To achieve the above object, a cleaning composition for removing residues according to the present invention is characterized in that it contains quaternary ammonium hydroxide, water and either boric acid or an N-substituted aminocarboxylate. The cleaning composition of the present invention may further contain an organic acid.

In one embodiment of the invention, the cleaning composition is in the form of an aqueous solution comprising:
  a.) at least one quaternary ammonium hydroxide compound selected from the group consisting of tris(2-hydroxyethyl)methylammonium hydroxide (THEMAH), tetramethylammonium hydroxide (TMAH), TMAH pentahydrate, benzyltetramethylammonium hydroxide (BTMAH), tetrabutylammonium hydroxide (TBAH), choline; and mixtures thereof;
  b.) at least one chelating compound comprising either (1) boric acid or (2) at least one N-substituted aminocarboxylate selected from the group consisting of N-bis(2-hydroxyethyl)glycine (bicine), N-tris(hydroxymethyl) methyl glycine (tricine) and mixtures thereof; and, optionally (3) glycine, Iminodiacetic acid (IDA), Nitrilo trizacetic acid (NTA), Ethylenediammine Tetraacetic acid (EDTA), or mixtures thereof; and
  c.) water.

In one embodiment of the invention, the cleaning composition does not comprise a fluorine compound.

In a further embodiment, the cleaning composition is free from an alkaline metal and an alkaline earth metal.

In another embodiment of the invention, the cleaning composition comprises between about 0.01% to about 10.0% of the at least one quaternary ammonium hydroxide compound, between about 0.01% and about 15.0% of the at least one chelating compound, and the balance water.

In one embodiment, the cleaning composition of the invention comprises between about 0.1% and about 5.0% of THEMAH; between about 0.1% and about 5.0% of tricine; between about 0.1% and about 5.0% of iminodiacetic acid; and between about 85.0% and about 99.7% of water.

In another embodiment, the cleaning composition of the invention comprises between about 0.1% and about 5.0% of THEMAH; between about 0.1% and about 5.0% of bicine; between about 0.1% and about 5.0% of iminodiacetic acid; and between about 85.0% and about 99.7% of water.

The cleaning composition of the invention can further comprise a pH adjuster selected from the group consisting of organic acids, alkanolamines, inorganic acids and mixtures thereof. In such embodiments, if boric acid is present in the composition, the total weight percentage of boric acid docs not exceed 15 weight %.

In one embodiment of the invention, the cleaning composition has a pH of between about 4 and about 7.

In another embodiment of the invention, the cleaning composition comprises boric acid, which is present at a concentration in the range of about 0.1 to about 5% based on total composition.

In one embodiment of the invention, the cleaning composition comprises between about 0.1% and about 5.0% of THEMAH; between about 0.1% and about 5.0% of boric acid; between about 0.1% and about 5.0% of iminodiacetic acid; and between about 85.0% and about 99.7% of water.

In another embodiment of the invention, the chelating compound used in the cleaning composition does not comprise at least one N-substituted aminocarboxylate.

In certain embodiments of the invention, the cleaning can further comprise an additional compound selected from the group consisting of a diamine, a polyalcohol, polyethylene oxide, a polyamine, a polyimine, 1-hydroxyethylidene-1,1-diphosphonic acid (HEDP), amino tri(methylene phosphonic acid) (ATMP), diethylenetriamine penta(methylene phosphonic acid) (DTPMPA), hexamethylenediaminetetra (methylenephosphonic acid) (HMDTMPA), 2-hydroxyethyliminobis(methylene phosphonic acid) (HEBMP), 2-phosphonobutane-1,2,4-tricarboxylic Acid (PBTC), Ethylene diamine tetra(methylene phosphonic acid) (EDTMP), ethylene diamine disuccinatehydroyethyl imino diacetic acid (HIDA), hydroxyethyl ethylene diamine triacetic acid (HEDTA), diethylene triamine pentaacetic acid (DTPA), triethylene tetramine hexaacetic acid (TTHA), dicarboxymethyle glutamic acid tetrasodium salt (GLDA), 1,3-propane diamine tetraacetic acid (PDTA), 1,3-diamino-2-hydroxypropane tetraacetic acid (DPTA-OH), glycol ether diamine tetraacetic acid (GEDTA), trans-1,2-diaminocyclohexane-N, N,N',N'-tetraacetic acid (CyDTA), 1-(4-aminobenzyl)ethylenediamine-N,N,N',N'-tetraacetic acid, N-(2-acetamido)iminodiacetic acid, 1-(4-isothiocyanatobenzyl) ethylenediamine-N,N,N',N'-tetraacetic acid, nitrilotris (methylene phosphonic acid) (NTMP), phosphonobutane tricarboxylic acid (PBTC), ethylene diamine tetra(methylene phosphonic acid) (EDTMP), alanine, arginine, asparagine, aspartic acid, cysteine, glutamine, glutamic acid, histidine, isoleucine, leucine, lysine, methionine, phenylalanine, praline, serine, threonine, tryptophan, tyrosine, valine, thioglycolic acid, thiodibutyric acid and mixtures thereof.

In another embodiment of the invention, the cleaning composition comprises less than about 0.1% of organic solvents.

DESCRIPTION OF THE PREFERRED EMBODIMENTS

It will be appreciated that the invention provides a cleaning composition for removing residues, said cleaning composition characterized in that it contains at least one quaternary ammonium hydroxide compound, water, and at least one chelating compound, which further comprises either boric acid or an N-substituted aminocarboxylate.

The compositions of the invention are available for use on most substrates, i.e., both metal and low-k dielectric substrates, and resists. The compositions are particularly useful on copper/porous low-k interconnects.

The compositions of the present invention are beneficially essentially free of a fluorine component or solvent. Moreover, the compositions of the present invention have a neutral pH between 4 and 7. Such compositions prevent k-value shift and CD loss caused by dissolution of a damaged layer on low-k dielectric and other substrates.

The amount of water in the cleaning compositions must be present in a range of from about 10% to about 99.7%, preferably between about 30% and about 99.7%, and more preferably between about 85.0% and about 99.7%.

It must be noted that water-based non-fluorine compound formulations described herein are better for cleaning certain low k substrates compared to fluorine compound containing formulations.

The compositions of the invention beneficially contain at least about 0.1%, and more preferably at least about 0.2%, of at least one quaternary ammonium hydroxide compound selected from the group consisting of THEMAH, TMAH, TMAH pentahydrate, BTMAH, TBAH, choline, and mixtures thereof. In one embodiment, the composition contains between about 0.1% and about 5.0%, preferably between about 0.2% and about 2.0%, and more preferably between about 1.0% and about 2.0% of a chelating compound, said chelating compound comprising either boric acid or at least one N-substituted aminocarboxylate.

Occasionally, the compositions are given in "parts," which means parts by weight of a composition that has nominally 100 parts total, i.e., 90 parts to 110 parts total.

In one embodiment the composition of the invention preferably comprises between at least about 0.1% of a quaternary ammonium hydroxide compound selected from the group consisting of THEMAH, TMAH, TMAH pentahydrate, BTMAH, TBAH, choline, and mixtures thereof; at least about 0.1% of a chelating compound comprising either boric acid or at least one N-substituted aminocarboxylate and further comprises additional organic acid. The preferred organic acids are glycine, iminodiacetic acid (IDA), nitrilo trizacetic acid (NTA), ethylenediamine tetraacetic acid (EDTA), citric acid, malic acid, tartaric acid, lactic acid, formic acid, glyoxylic acid, acetic acid, propionic acid, glycolic acid, 1-hydroxyethylidene-1,1-diphosphonic acid (HEDP), amino tri(methylene phosphonic acid) (ATMP), diethylenetriamine penta(methylene phosphonic acid) (DTPMPA), hexamethylenediaminetetra(methylenephosphonic acid) (HMDTMPA), 2-hydroxyethyliminobis(methylene phosphonic acid) (HEBMP), 2-phosphonobutane-1,2,4-tricarboxylic Acid (PBTC), ethylene diamine tetra(methylene phosphonic acid) (EDTMP), ethylene diamine disuccinatehydroyethyl imino diacetic acid (HIDA), hydroxyethyl ethylene diamine triacetic acid (HEDTA), diethylene triamine pentaacetic acid (DTPA), methylene tetramine hexaacetic acid (TTHA), dicarboxymethyle glutamic acid tetrasodium salt (GLDA), 1,3-propane diamine tetraacetic acid (PDTA), 1,3-diamino-2-hydroxypropane tetraacetic acid (DPTA-OH), glycol ether diamine tetraacetic acid (GEDTA), trans-1,2-diaminocyclohexane-N,N,N',N'-tetraacetic acid (CyDTA), 1-(4-Aminobenzyl)ethylenediamine-N,N,N',N'-tetraacetic acid, N-(2-Acetamido)iminodiacetic acid, 1-(4-Isothiocyanatobenzyl) ethylenediamine-N,N,N',N'-tetraacetic acid, nitrilotris (methylene phosphonic acid) (NTMP), phosphonobutane pricarboxylic acid (PBTC), ethylene diamine tetra(methylene phosphonic acid) (EDTMP), alanine, arginine, asparagine, aspartic acid, cysteine, glutamine, glutamic acid, histidine, isoleucine, leucine, lysine, methionine, phenylalanine, praline, serine, threonine, tryptophan, tyrosine, valine, thioglycolic acid, thiodibutyric acid or a mixture thereof. The preferred organic acids are imimodiacetic acid (IDA), ethylenediammine tetraacetic acid (EDTA), citric acid, glycolic acid and cystein. The more preferred organic acid is imimodiacetic acid (IDA). The organic acid is typically present in concentrations of about 5.0% or less, preferably about 3.0% or less. The N-substituted aminocarboxylates can include bicine, tricine and mixtures thereof.

The quaternary ammonium hydroxide, for example THEMAH, is advantageously present in an amount ranging from about 0.1% to about 5.0%, preferably from about 0.2% to about 2.0%, and even more preferably from about 0.2% to about 1.0%.

TMAH, if present, is advantageously present in an amount less than about 5.0%, advantageously in an amount between 0.1% and 2.0%, for example between 0.2% and 1.0%.

Boric acid or at least one N-substituted aminocarboxylate, whichever is present, is advantageously present in an amount ranging from about 0.1% to about 5.0%, preferably from about 0.1% and about 2.5%, and even more preferably from about 0.2% to about 2.5%. Exemplary N-substituted aminocarboxylates include bicine and tricine or mixtures thereof.

If combinations of the at least one quaternary ammonium hydroxide compound and the chelating compound (comprising either boric acid or the N-substituted aminocarboxylate) are used in a composition, the concentration should be reduced accordingly to not exceed the 2.5% given as a preferred upper limit for the quaternary ammonium hydroxide compound.

If an organic acid is present in the composition of the invention, it is advantageously present in an amount between about 0.1% and about 5.0%, and preferably between about 0.2 and about 2.5%. The preferred organic acids are glycine, iminodiacetic acid (IDA), nitrilo trizacetic acid (NTA), ethylenediammine tetraacetic acid (EDTA), citric acid, malic acid, tartaric acid, lactic acid, formic acid, glyoxylic acid, acetic acid, propionic acid, glycolic acid, 1-hydroxyethylidene-1,1-diphosphonic acid (HEDP), amino tri (methylene phosphonic acid) (ATMP), diethylenetriamine penta(methylene phosphonic acid) (DTPMPA), hexamethylenediaminetetra(methylenephosphonic acid) (HMDTMPA), 2-hydroxyethyliminobis(methylene phosphonic acid) (HEBMP), 2-phosphonobutane-1,2,4-tricarboxylic acid (PBTC), ethylene diamine tetra(methylene phosphonic acid) (EDTMP), ethylene diamine disuccinate-hydroyethyl imino diacetic Acid (HIDA), hydroxyethyl ethylene diamine triacetic acid (HEDTA), diethylene triamine pentaacetic acid (DTPA), triethylene tetramine hexaacetic acid (TTHA), dicarboxymethyle glutamic acid tetrasodium salt (GLDA), 1,3-propane diamine tetraacetic acid (PDTA), 1,3-diamino-2-hydroxypropane tetraacetic acid (DPTA-OH), glycol ether diamine tetraacetic acid (GEDTA), trans-1,2-diaminocyclohexane-N,N,N',N'-tetraacetic acid (Cy-DTA), 1-(4-aminobenzyl)ethylenediamine-N,N,N',N'-tetraacetic acid, N-(2-acetamido)iminodiacetic acid, 1-(4-isothiocyanatobenzyl)ethylenediamine-N,N,N',N'-tetraacetic acid, nitrilotris (methylene phosphonic acid) (NTMP), phosphonobutane tricarboxylic acid (PBTC), ethylene diamine tetra(methylene phosphonic acid) (EDTMP), alanine, arginine, asparagine, aspartic acid, cysteine, glutamine, glutamic acid, histidine, isoleucine, leucine, lysine, methionine, phenylalanine, praline, serine, threonine, tryptophan, tyrosine, valine, thioglycolic acid, thiodibutyric acid or a mixture thereof. The preferred organic acids are imimodiacetic acid (IDA), ethylenediammine tetraacetic acid (EDTA), citric acid, glycolic acid and cystein. The more preferred organic acid is IDA.

Other chemical additives can be used in the cleaning compositions of the invention to improve desired performance. These include, for example, surfactants, additional chelating compounds, corrosion inhibitors, and the like. Examples of such chemical additives are 1H-1,2,3-triazole, 1,2,3-triazole 4,5-dicarboxyl acid, 1,2,4-triazole and 1H-1,2,4-triazole 3-thiol, 3-amino-triazole, benzotriazole, 1-amino-benzotriazole, 1-hydroxy-benzotriazole, 5-methyl-1H-benzotriazole, and benzotriazole 5-carboxylic acid, imidazole, 1-methylimidazole, benzimidazole, 1-methyl-benzimidazole, 2-methyl-benzimidazole, 5-methyl-benzimidazole, 1H-tetrazole, 5-amino-tetrazole, Benzothiazole, 2-methyl-benzothiazole, 2-amino-benzothiazole, 6-amino-benzothiazole, 2-mercapto-benzothiazole, isoxazole, benzoxazol, 2-methyl-benzoxazol, 2-mercapto-benzoxazol, pyrazole, 4-pyrazole carboxylic acid, cupferron, endole, quinolinol, quinaldic acid, o-phenanthroline, N,N,N',N',N''-pentamethyldiethylenetriamine (PMDETA), 2,2'-bipyridine and epoxy-polyamide compound. Preferably, the total concentration of these components is below about 10% by weight, and more preferably below about 5% by weight.

Cleaning and corrosion vary with pH for many of these compositions. It is preferred to vary pH to meet the specific requirements of the substrate by adding, for example, a pH adjuster to achieve a pH of between about 5 and about 7. A pH of between about 4 and about 7, for example, about 6, will provide cleaning compositions that are most compatible with low-k dielectrics, for example HSQ.

Other corrosion inhibitors that can be used in the cleaning compositions of the invention include salicyl alcohol, salicyl aldoxime, gallic acid, gallic acid esters and pyrogallol.

Suitable chelating compounds, in addition to those previously discussed, are described in commonly assigned U.S. Pat. No. 5,672,577, issued Sep. 30, 1997 to Lee, which is incorporated herein by reference. One suitable chelating agent is EDTA. Others, including DTPA, can be used. The addition of a chelating agent can further improve the effectiveness of the formulation used as a etch residue or photoresist remover.

Suitable surfactants are selected from, for example, nonionic types, cationic types and anionic types of surfactants. Suitable surfactants include, but are not limited to, poly (vinyl alcohol), poly(ethyleneimine) and any of the surfactant compositions classified as anionic, cationic, nonionic, amphoteric, and silicone-based. Preferred surfactants are poly (vinyl alcohol), poly(ethyleneimine) and epoxy-polyamide compound.

Preferably, a surfactant is present in the cleaning composition of the present invention, typically in the amount of about 1 ppm to 500 ppm by weight based on the total weight of the cleaning composition.

Unless otherwise specified, the compositions are given in weight percent.

One preferred embodiment of the present invention is a cleaning composition comprising from about 0.1% to about 5.0% by weight of a quaternary ammonium hydroxide compound selected from the group consisting of THEMAH, TMAH, TMAH pentahydrate, BTMAH, TBAH, choline, and mixture thereof; from about 0.1% to about 5.0% of a chelating compound comprising either boric acid or the N-substituted aminocarboxylates and from about 0.1% to about 5.0% water, and, optionally, an organic acid, preferably IDA, corrosion inhibitors, additional chelating compounds, and/or surfactants.

Another embodiment is a cleaning composition comprising from about 0.1% to about 5.0% of at least one N-substituted aminocarboxylate selected from bicine and tricine, 85.0% to about 99.7% water, and optionally also containing, corrosion inhibitors, chelating agents, and/or surfactants.

In another embodiment, the cleaning composition of the invention comprises THEMAH in an amount from about 0.1 wt % to about 5.0 wt %, and the N-substituted aminocarboxylates in an amount from about 0.1 wt % to about 5.0 wt %, and water in an amount from about 85.0 wt % to about 99.7 wt %. The N-substituted aminocarboxylates can include bicine, tricine or a mixture thereof.

Advantageously, the compositions of the present invention contain substantially no fluorine compounds, e.g., ammonium bifluoride. In this context, substantially no fluoride compounds means less than about 0.5%, preferably less than about 0.3%, fluorine compounds. In selected preferred embodiments, the compositions of the present invention contain no fluorine compounds, i.e., less than about 0.1%, preferably less than about 0.01%, of fluorine compounds. The fluoride-based chemistry (exemplified by ARX60 composition in the Examples) causes unacceptable etching rates on many substrates and damages low-k dielectric.

Advantageously, the compositions of the invention contain no hydroxylamines, i.e., less than about 0.1%, preferably less than about 0.01%, hydroxylamines, when used with certain substrates, as shown in the Examples. Hydroxylamines cause delamination in certain low-k substrates.

Advantageously, the compositions of the present invention contain no organic solvents, i.e., less than about 0.1%, preferably less than about 0.01%, organic solvents. Solvents cause environmental, disposal, and operational problems and adversely affect low-k dielectric compatibility.

The preferred compositions of the invention comprise each of the one or more quaternary ammonium hydroxide compounds, the N-substituted aminocarboxylates, an organic acid and water. Such compositions were found to be less corrosive and more compatible with low k substrates than other acid based chemistries.

Advantageously, the cleaners of the present invention, particularly those comprising quaternary ammonium hydroxide compounds, the N-substituted aminocarboxylates, an organic acid and water, can remove resist, ashed material, and the like without unacceptably etching the substrate and damage of low-k dielectric. The compositions of the current invention and the temperatures are advantageously selected to clean the substrate in 30 minutes or less, preferably 15 minutes or less;

to provide a substrate etch (or growth) rate of less than 3 angstroms per minute, preferably less than 1 angstrom per minute, when contacting the substrate for 15 minutes at the desired cleaning temperature; and change the refractive index by less than 0.005, preferably by less than 0.003, and change the k-value of low-k dielectric by less than 0.02, preferably by less than 0.01 when contacting the substrate for 15 minutes at the desired cleaning temperature.

Advantageously, the pH of the cleaner is between about 4 and about 7, preferably between about 5 and about 7. For low k substrates, the pH of the cleaner is preferably between about 5 and about 7.

Advantages of the aqueous-based cleaners of the present invention include excellent cleaning, oxidation-preventing effects on copper surfaces, $CuO_x$ removal ability, compatibility with low-k materials, low toxicity, very low cost, fewer quality control issues, ease of disposal, low viscosity, i.e., less than 5 centipoise, for example near 1 centipoise at 50 C, which allows for spray application, and usefulness for metal and conventional applications. The cleaners of the present invention are particularly useful for low-k/Al and low-k/Cu substrates.

In one embodiment, the composition may include hydroxylamine. In this case, hydroxylamine may be used as a corrosion inhibitor.

The method of cleaning substrates, particularly low-k substrates, is also contemplated to be part of this invention. As shown in the examples below, certain compositions perform particularly well with certain substrates. The following examples are illustrative of compositions of the present invention. As used herein, "%" and "parts" are % by weight and parts by weight.

The following Examples are merely illustrative of the invention and are not intended to be limiting.

Table 1 below summarizes exemplary compositions as identified hereinbelow and results of tests for residue removal, copper etch rate and k-value shift, respectively. All chemicals listed in Table 1 were purchased from Wako Pure Chemical, Osaka, Japan, and used without any further purification unless otherwise mentioned. The following abbreviations may be used herein: THEMAH=tris(2-hydroxyethyl) methylammonium hydroxide; Tricine=N-tris (hydroxymethyl)methyl glycine; IDA=Iminodiacetic acid; Bicine=N,N-bis(2-hydroxyethyl)glycine; $NH_4F$=Ammonium fluoride; PGME=Propylene glycol monoMethyl ether; DMAc=Dimethyl acetamide; DGBE=Diethylene glycol butyl ether; DEEA=N,N-Diethyl-ethanolamine. Note that percentages listed in the column are for components that are themselves percentages. For example, for composition 1, there is 0.5% of a solution of 50% tris(2-hydroxyethyl)methylammonium hydroxide (THEMAH) in water; 0.225% of N-tris(hydroxymethyl)methyl glycine (tricine); 2.0% of iminodiacetic acid (IDA); and 97.275% additional water. Thus, the actual weight percentage of THEMAH in composition 1 is about 0.25% (i.e., 0.5×50%=0.25%), and the actual weight percentage of water is 97.575% [i.e. (0.5×50%)+97.275%=97.575%].

Post Etch Residue Removal:

Copper dual damascene test element group (TEG) patterned wafer was used for this study. After cleaning with each composition in Table 1, TEG wafer was cut into small pieces for SEM observation. Post etch reside removal was evaluated by observation of damascene cross sectional image observed by using Hitachi SEM (S-5200). In Table 1, "good" means that no post etch residue observed and "not good" means post etch residue was observed, respectively.

Copper Etch Rate in Each Composition:

Copper blanket wafers used in this study were purchased from Friend Science Co. Ltd. Copper films was prepared on Si wafers by plating process with the thickness of 1000 Å. The copper film thickness was determined by four-point probe measurement (Four Dimensions, Hayward Calif. Model 280) of the change in sheet resistance of blanket samples. Copper etch rates at various compositions were evaluated at 25° C., for times ranging of 30 minutes. The copper etch rate was calculated from a thickness measured before and after treatment in each composition. The copper etch rates of each composition are listed in Table 1.

Low-k Dielectric Compatibility:

Porous Methyl Silsesquioxane low-k blanket wafer (k value=2.2) was used for low-k dielectric compatibility test. Refractive index and k-value were selected as indexes of low-k compatibility. Porous low-k wafer pieces were immersed in each composition for 10 minutes at room temperature, rinsed with DIW and dried with N2 blow drier. Thickness and refractive index of Porous low-k were measured by using by optical interferometer (NanoSpec 6100, Nanometrics Inc. Milipitas Calif.). Before measurement of k-value, porous low-k wafer was baked in an oven at 200° C. for 20 minutes to remove water. K-values were measured by using a Hg-probe relative dielectric constant meter (Four Dimensions, CV-map 3092A). K value shift listed in Table 1 was calculated from k value before and after treatment with each composition. In this example, K-value shift less than 0.01 means good low-k compatibility

TABLE 1

|  | composition 1 |  | composition 2 |  | composition 3 |  | composition 4 |  |
| --- | --- | --- | --- | --- | --- | --- | --- | --- |
| component 1 | THEMAH | 0.25% | THEMAH | 0.50% | THEMAH | 0.50% | NH4F | 0.12% |
| component 2 | Ticine | 2.00% | Boric acid | 2.00% | Bicine | 1.50% | Dimmonium Hydrogenigate | 10.00% |
| component 3 | DA | 0.225% | DA | 0.45% | DA | 2.00% | PGME | 1.00% |
| component 4 | water | 97.75% | water | 97.05% | water | 96.00% | water | 88.88% |
| Residue removal | good |  | good |  | good |  | good |  |
| Cuetch rate (nm/30 min) | 2.3 |  | 2.0 |  | 1.3 |  | 2.0 |  |
| refractive index shift | 0.002 |  | 0.001 |  | 0.001 |  | 0.001 |  |
| k value shift | 0.008 |  | 0.002 |  | 0.007 |  | 0.054 |  |
| pH | 6.0 |  | 6.2 |  | 6.5 |  | 5.0 |  |
|  | composition 5 |  | composition 6 |  | composition 7 |  | composition 8 |  |
| component 1 | NH4F | 0.12% | THEMAH | 0.50% | DEEA | 1.70% |  |  |
| component 2 | DMAc | 40.00% | DA | 1.75% | bicine | 2.50% |  |  |
| component 3 | Citric acid | 6.00% | DEEA | 1.50% | DA | 1.00% |  |  |

TABLE 1-continued

| | monohydrate | | | | | |
|---|---|---|---|---|---|---|
| component 4 | water | 53.88% | water | 96.26% | water | 94.80% |
| Residue removal | | good | | good | | good |
| Cuetch rate (nm/30 min) | | 3.2 | | 5.1 | | 6.0 |
| refractive index shift | | 0.010 | | 0.003 | | 0.002 |
| k value shift | | 0.496 | | 0.171 | | 0.148 |
| pH | | 6.0 | | 6.0 | | 6.0 |

The foregoing data of compositions 1 to 3 show the synergy between the components, and that formulations of the invention have excellent residue removal from dual damascene structure as well as excellent copper and low-k compatibility. Compositions containing no quaternary ammonium hydroxide and boric acid or N-substituted aminocarboxylates compositions (composition 4 to 7) also show good residue removal; however, such compounds do not show copper and low-k compatibility as compared to the compositions of the present invention.

What is claimed is:

1. A cleaning composition in the form of an aqueous solution comprising:
    a) between about 0.1% and about 5.0% of tris (2-hydroxyethyl) methylammonium hydroxide (THEMAH);
    b) between about 0.1% and about 5.0% of N-tris(hydroxymethyl)methyl glycine (tricine);
    c) between about 0.1% and about 5.0% of iminodiacetic acid; and
    d) between about 85.0% and about 99.7% of water.

2. A cleaning composition in the form of an aqueous solution comprising:
    a) between about 0.1% and about 5.0% of tris (2-hydroxyethyl) methylammonium hydroxide (THEMAH);
    b) between about 0.1% and about 5.0% of N-bis(2-hydroxyethyl)glycine (bicine);
    c) between about 0.1% and about 5.0% of iminodiacetic acid; and
    d) between about 85.0% and about 99.7% of water.

3. The cleaning composition of claim 1 or claim 2 further comprising a pH adjuster selected from the group consisting of organic acids, alkanolamines, inorganic acids and mixtures thereof.

4. The cleaning composition of claim 3 where the pH is between about 4 and about 7.

5. The cleaning composition of claim 3 or claim 4 further comprising an additional compound selected from the group consisting of a diamine, a polyalcohol, polyethylene oxide, a polyamine, a polyimine, 1-hydroxyethylidene-1,1-diphosphonic acid (HEDP), amino tri (methylene phosphonic acid) (ATMP), diethylenetriamine penta(methylene phosphonic acid) (DTPMPA), hexamethylenediaminetetra (methylenephosphonic acid) (HMDTMPA), 2-hydroxyethyliminobis (methylene phosphonic acid) (HEBMP), 2-phosphonobutane-1,2,4-tricarboxylic Acid (PBTC), ethylene diamine tetra (methylene phosphonic acid) (EDTMP), ethylene diamine disuccinatehydroyethyl imino diacetic acid (HIDA), hydroxyethyl ethylene diamine triacetic acid (HEDTA), diethylene triamine pentaacetic acid (DTPA), triethylene tetramine hexaacetic acid (TTHA), dicarboxymethyle glutamic acid tetrasodium salt (GLDA), 1,3-propane diamine tetraacetic acid (PDTA), 1,3-diamino-2-hydroxypropane tetraacetic acid (DPTA-OH), glycol ether diamine tetraacetic acid (GEDTA), trans-1,2-diaminocyclohexane-N,N,N',N'-tetraacetic acid (CyDTA), 1-(4-aminobenzyl)ethylenediamine-N,N,N',N'-tetraacetic acid, N-(2-acetamido)iminodiacetic acid, 1-(4-isothiocyanatobenzyl)ethylenediamine-N,N,N', N'-tetraacetic acid, nitrilotris (methylene phosphonic acid) (NTMP), phosphonobutane tricarboxylic acid (PBTC), ethylene diamine tetra(methylene phosphonic acid) (EDTMP), alanine, arginine, asparagine, aspartic acid, cysteine, glutamine, glutamic acid, histidine, isoleucine, leucine, lysine, methionine, phenylalanine, praline, serine, threonine, tryptophan, tyrosine, valine, thioglycolic acid, thiodibutyric acid and mixtures thereof.

\* \* \* \* \*

UNITED STATES PATENT AND TRADEMARK OFFICE
CERTIFICATE OF CORRECTION

| | |
|---|---|
| PATENT NO. | : 7,825,079 B2 |
| APPLICATION NO. | : 12/463645 |
| DATED | : November 2, 2010 |
| INVENTOR(S) | : Tomoco Suzuki et al. |

It is certified that error appears in the above-identified patent and that said Letters Patent is hereby corrected as shown below:

Column 1, line 17: Delete "Al(Cu)" and replace with -- AI (Cu) --
Column 3, line 45: Delete "Al(Cu)" and replace with -- AI (Cu) --
Column 4, line 31; Delete "docs" and replace with -- does --
Column 9, line 21: Delete "low-k/Al" and replace with -- low-k/A I --
Column 10, Table 1: Under "composition 4", line 2: Delete "Dimmonium" and replace with -- Diammonium --
Column 12, line 17: Delete " -1,1- diphos-" and replace with -- -1,1, -diphos- --

Signed and Sealed this
Twenty-ninth Day of March, 2011

David J. Kappos
*Director of the United States Patent and Trademark Office*